United States Patent
Li et al.

(10) Patent No.: US 11,239,358 B2
(45) Date of Patent: Feb. 1, 2022

(54) SEMICONDUCTOR STRUCTURE WITH ISOLATION STRUCTURES IN DOPED REGION AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Mao Li, Shanghai (CN); Dae Sub Jung, Shanghai (CN); De Yan Chen, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 2 days.

(21) Appl. No.: 16/745,601

(22) Filed: Jan. 17, 2020

(65) Prior Publication Data
US 2020/0251590 A1  Aug. 6, 2020

(30) Foreign Application Priority Data
Jan. 31, 2019 (CN) .......................... 201910097564.4

(51) Int. Cl.
*H01L 29/78* (2006.01)
*H01L 29/06* (2006.01)
(Continued)

(52) U.S. Cl.
CPC ...... *H01L 29/7816* (2013.01); *H01L 21/0217* (2013.01); *H01L 21/02164* (2013.01); *H01L 21/26513* (2013.01); *H01L 21/308* (2013.01); *H01L 21/30604* (2013.01); *H01L 21/76224* (2013.01); *H01L 29/063* (2013.01);
(Continued)

(58) Field of Classification Search
CPC .......... H01L 29/7816; H01L 29/66681; H01L 29/063; H01L 29/0619; H01L 29/0878; H01L 29/66659; H01L 29/7835; H01L 29/0847; H01L 29/1083; H01L 29/0653;
(Continued)

(56) References Cited

U.S. PATENT DOCUMENTS

2015/0243766 A1* 8/2015 Tu ................... H01L 29/0653
257/329
2017/0047338 A1* 2/2017 Shinohara ........... H01L 29/7816

* cited by examiner

*Primary Examiner* — Sonya McCall-Shepard
(74) *Attorney, Agent, or Firm* — Anova Law Group, PLLC

(57) ABSTRACT

A semiconductor structure and fabrication method are provided. The method includes: providing a substrate with a first doped region and a second doped region; forming discrete first isolation structures in the second doped region; forming a third doped region in the second doped region between adjacent first isolation structures and under the first isolation structures; forming a gate structure; forming a source region in the first doped region; and forming a drain region in the second doped region. The first doped region includes first doping ions and the second doped region includes second doping ions with a conductivity type opposite to a conductivity type of the first doping ions. The third doped region includes third doping ions with a conductivity type opposite to the conductivity type of the second doping ions. A portion of the first isolation structure is located between the gate structure and the drain region.

14 Claims, 4 Drawing Sheets

(51) Int. Cl.
*H01L 29/10* (2006.01)
*H01L 21/02* (2006.01)
*H01L 29/66* (2006.01)
*H01L 21/306* (2006.01)
*H01L 21/308* (2006.01)
*H01L 21/265* (2006.01)
*H01L 21/762* (2006.01)

(52) U.S. Cl.
CPC ...... *H01L 29/0653* (2013.01); *H01L 29/1095* (2013.01); *H01L 29/66681* (2013.01)

(58) Field of Classification Search
CPC ............... H01L 29/1095; H01L 21/761; H01L 21/02164; H01L 21/76224; H01L 21/0217
See application file for complete search history.

SEMICONDUCTOR STRUCTURE WITH ISOLATION STRUCTURES IN DOPED REGION AND FABRICATION METHOD THEREOF

CROSS-REFERENCES TO RELATED APPLICATION

This application claims the priority of Chinese Patent Application No. 201910097564.4, filed on Jan. 31, 2019, the content of which is incorporated herein by reference in its entirety.

TECHNICAL FIELD

The present disclosure generally relates to the field of semiconductor technologies and, more particularly, relates to a semiconductor structure and its fabrication method.

BACKGROUND

Since lateral double diffusion metal-oxide-semiconductor (LDMOS) transistors have a high breakdown voltage and are compatible with complementary metal-oxide-semiconductor (CMOS) technologies, the LDMOS transistors are widely used in power devices. In a MOS transistor, a source region and a drain region are disposed symmetrically with respect to a gate. In comparison with the MOS transistor, in an LDMOS transistor, a drain region is farther from a gate than a source region and there is a long lightly doped region between the drain region and the gate. The long lightly doped region is referred to as a drift region. When the source region and the drain region in the LDMOS transistor are connected to a high voltage, the drift region is used to withstand a high voltage drop to achieve a high breakdown voltage. In addition to the high voltage withstanding, the LDMOS transistor is required to have a low on-state resistance and a high safety operating range.

However, performances of the LDMOS transistors formed by current technologies cannot meet the above requirements simultaneously. Thus, there is a need to provide a LDMOS transistor with a high voltage withstanding, a low on-state resistance, and a high safety operating range.

SUMMARY

One aspect of the present disclosure provides a fabrication method for forming a semiconductor structure. The method includes: providing a substrate with a first doped region and a second doped region adjacent to the first doped region; forming a plurality of discrete first isolation structures in the second doped region; forming a third doped region in the second doped region between adjacent first isolation structures of the plurality of first isolation structures and under the plurality of first isolation structures; forming a gate structure on a portion of a surface of the first doped region, on a portion of a surface of the second doped region, and on a portion of surfaces of the plurality of first isolation structures; forming a source region in the first doped region at a side of the gate structure; and forming a drain region in the second doped region at another side of the gate structure. The first doped region includes first doping ions and the second doped region includes second doping ions with a conductivity type opposite to a conductivity type of the first doping ions. The third doped region includes third doping ions with a conductivity type opposite to the conductivity type of the second doping ions. A portion of the plurality of first isolation structure is located between the gate structure and the drain region.

Another aspect of the present disclosure provides a semiconductor structure. The semiconductor structure includes: a substrate with a first doped region and a second doped region; a plurality of discrete first isolation structures in the second doped region; a third doped region in the second doped region between adjacent first isolation structures of the plurality of first isolation structures and under the plurality of first isolation structures; a gate structure on a portion of a surface of the first doped region, on a portion of a surface of the second doped region, and on a portion of surfaces of the plurality of first isolation structures; a source region in the first doped region at a side of the gate structure; and a drain region in the second doped region at another side of the gate structure. The first doped region includes first doping ions and the second doped region includes second doping ions with a conductivity type opposite to a conductivity type of the first doping ions. The third doped region includes third doping ions with a conductivity type opposite to the conductivity type of the second doping ions. A portion of the plurality of first isolation structure is located between the gate structure and the drain region.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
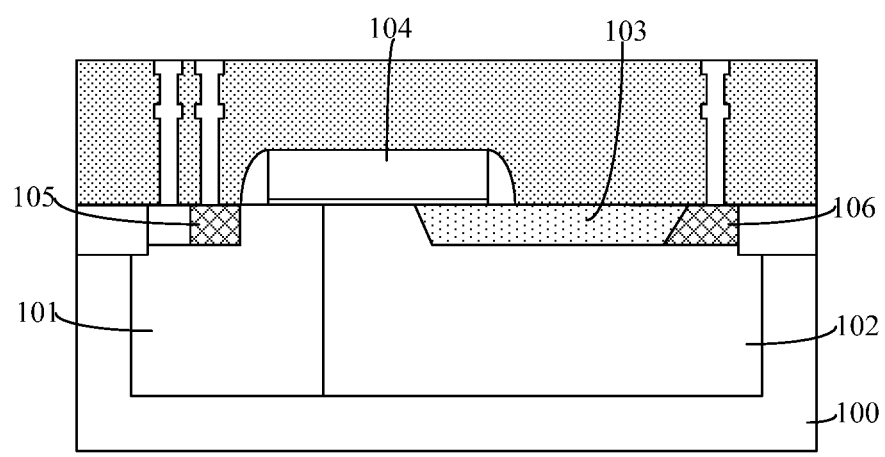
FIG. 1 illustrates a lateral double diffusion metal-oxide-semiconductor transistor.

FIG. 1 illustrates a lateral double diffusion metal-oxide-semiconductor (LDMOS) transistor.

As illustrated in FIG. 1, the LDMOS transistor includes: a substrate 100, a first doped region 101 in the substrate 100, a second doped region 102 adjacent to the first doped region 101 and in the substrate 100, a first isolation structure 103 in the second doped region 102, a gate structure 104 on a top of the substrate 100, a source region 105 in the first doped region 101 at a side of the gate structure 104, and a drain region 106 in the second doped region 102 at another side of the gate structure 104 and the first isolation structure 103. The first doped region 101 is doped with first doping ions, and the second doped region 102 is doped with second doping ions with a type opposite to a type of the first doping ions. The gate structure 104 covers a portion of the first doped region 101, a portion of the second doped region 102, and a portion of the first isolation structure 103.

Two important performance parameters of the above LDMOS transistor include a breakdown voltage and an on-state resistance. When the breakdown voltage is high, the transistor has a high reliability. When the on-state resistance is small, an electrical performance of the transistor is improved. Correspondingly, the LDMOS transistor with a high performance should have the high breakdown voltage and low on-state resistance.

The breakdown voltage of the device can be improved by: increasing a size of the first isolation structure 103 along a direction from the source region 105 to the drain region 106, or decreasing a doping concentration of the second doping ions in the second doped region 102. The on-state resistance will increase when increasing the size of the first isolation structure 103 along the direction from the source region 105 to the drain region 106. When reducing the doping concentration of the second doping ions in the second doped region 102, a resistance of the second doped region 102 may increase since the second doping ions are used to increase a conductivity of the second doped region 102. Conversely, reducing the size of the first isolation structure 103 along the direction from the source region 105 to the drain region 106 or increasing the doping concentration of the second doping ions in the second doped region 102 can reduce the on-state resistance of the device, but the breakdown voltage of the device may decrease. The above methods cannot increase the breakdown voltage and reduce the on-state resistance simultaneously.

Figure 2:
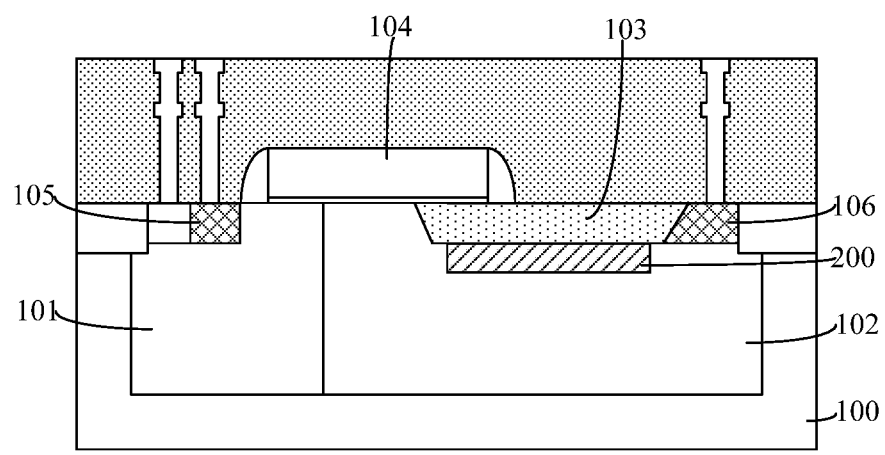
FIG. 2 illustrates another lateral double diffusion metal-oxide-semiconductor transistor.

FIG. 2 illustrates another LDMOS transistor. In comparison with the LDMOS transistor in FIG. 1, a third doped region 200 is formed in the second doped region at a bottom of the first isolation structure 103. The third doped region 200 is doped with third doping ions. The third doping ions have a type opposite to the type of the second doping ions.

In the LDMOS transistor in FIG. 2, a PN junction is formed between the third doped region 200 and the second doped region 102 since the type of the third doping ions is opposite to the type of the second doping ions. The concentration of the second doping ions in the second doped region 102 is increased to reduce the on-state resistance. Although the concentration of the second doping ions in the second doped region 102 is high, the breakdown voltage is enhanced since the PN junction can be completely depleted.

To further reduce the on-state resistance, the concentration of the second doping ions in the second doped region 102 has to be increased further. However, if the concentration of the second doping ions in the second doped region 102 is too large, the PN junction between the third doped region 200 and the second doped region 102 is difficult to be completely depleted. The breakdown voltage is hard to be enhanced further.

Correspondingly, the third doped region 200 has a limited capability to increase the breakdown voltage and reduce the on-state resistance.

The present disclosure provides a semiconductor structure and a fabrication method of the semiconductor structure, to at least partially alleviate above problems. The fabrication method may include: forming a plurality of discrete first isolation structure in a second doped region and forming a third doped region in the second doped region between the plurality of first isolation structure and under the plurality of first isolation structure. The third doped region may be doped with third doping ions and the third doping ions may have a type opposite to a type of second doping ions in the second doped region. A breakdown voltage may be enhanced and an on-state resistance may be reduced simultaneously.

Figure 5:
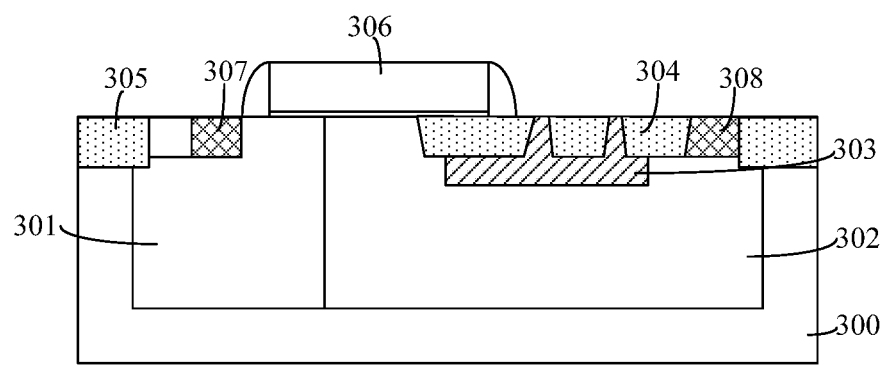
Figure 6:
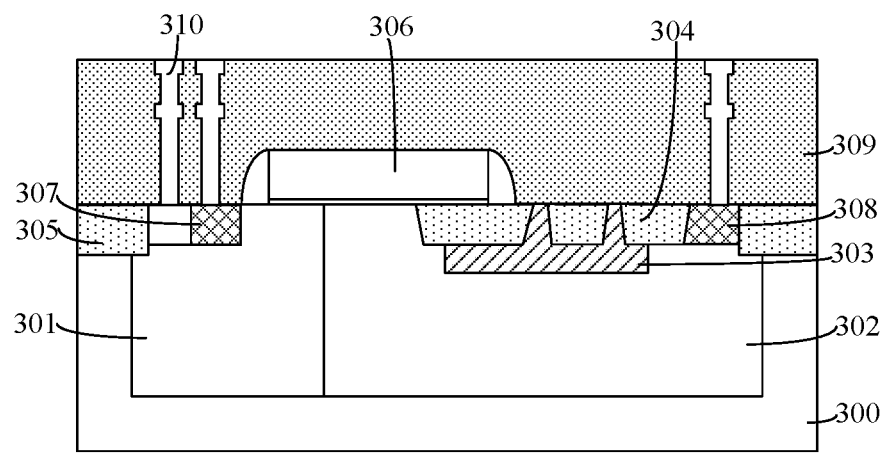
Figure 7:
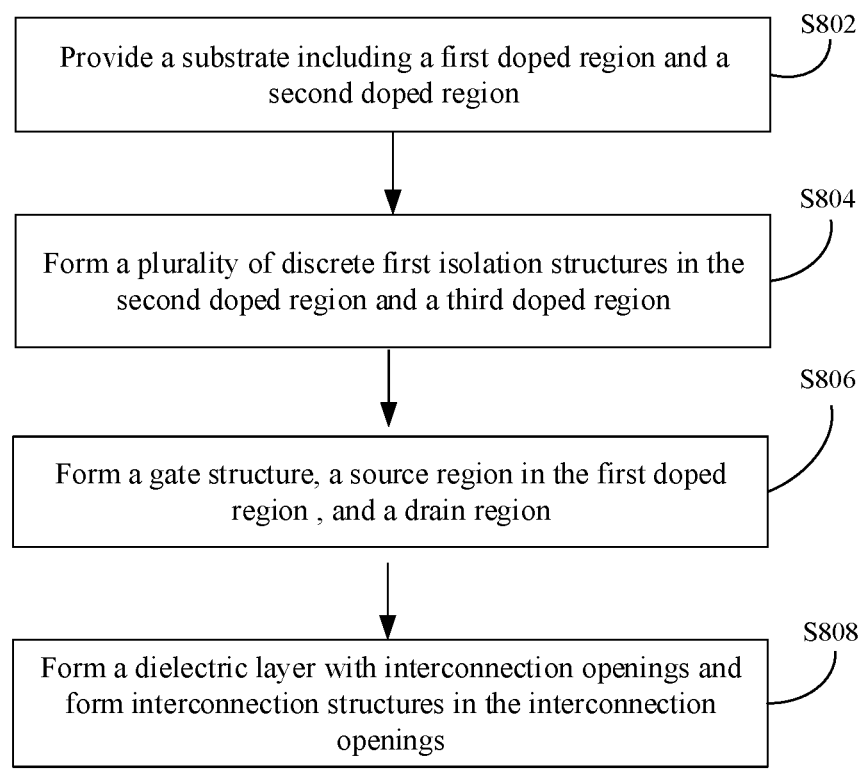
FIG. 7 illustrates an exemplary method for forming a semiconductor structure according to various disclosed embodiments.

FIG. 3 to FIG. 6 illustrate semiconductor structures corresponding to certain stages for forming an exemplary semiconductor structure according to various disclosed embodiments of the present disclosure; and FIG. 7 illustrates an exemplary method for forming a semiconductor structure according to various disclosed embodiments.

Figure 3:
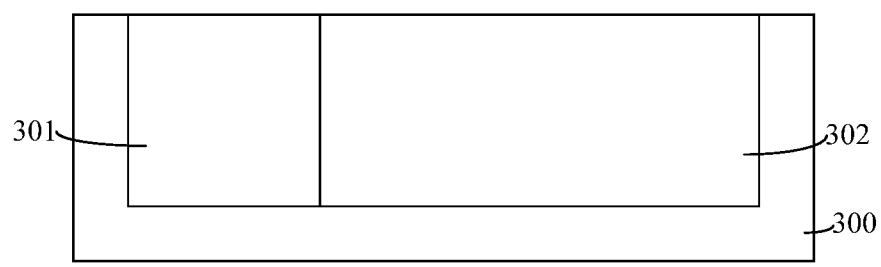
FIG. 3 to FIG. 6 illustrate semiconductor structures corresponding to certain stages for forming an exemplary semiconductor structure according to various disclosed embodiments of the present disclosure.

As illustrated in FIG. 3, a substrate 300 may be provided (e.g., in Step S802 in FIG. 7). The substrate 300 may include a first doped region 301 and a second doped region 302 adjacent to the first doped region 301. The first doped region 301 may be doped with first doping ions, and the second doped region 302 may be doped with second doping ions. A type of the first doping ions may be opposite to the second doping ions.

The substrate 300 may be made of a material including silicon and/or germanium.

The first doped region 301 may be formed by a first ion implanting process, and the second doped region 302 may be formed by a second ion implanting process.

In one embodiment, the first doping ions may be P-type ions and the second doping ions may be N-type ions. The P-type ions may include boron ions. The N-type ions may include phosphor ions or arsenic ions.

The second doping ions may be used to reduce a resistance of the second doped region 302, and may have a doping concentration of about $2\times10^{15}$ atoms/cm$^3$ to about $3\times10^{15}$ atoms/cm$^3$. The doping concentration of the second doping ions may be high. Correspondingly, an on-state resistance of the device may be reduced, and an electric performance of the device may be improved.

Figure 4:
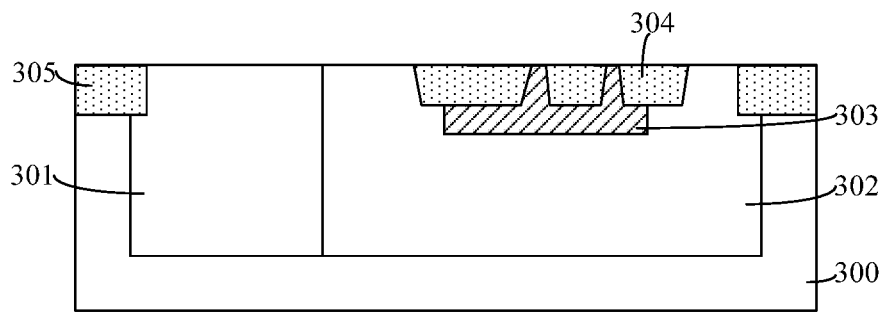

As illustrated in FIG. 4, a plurality of discrete first isolation structures 304 may be formed in the second doped region 302, and a third doped region 303 may be formed in the second doped region 302 between the plurality of first isolation structure 304 and under the plurality of first isolation structure 304 (e.g., Step S804 in FIG. 7). The third doped region 303 may include third doping ions with a conductivity type opposite to the type of the second doping ions.

The plurality of first isolation structure 304 may be formed by: forming a first mask layer on a top of the substrate 300, on a top of the first doped region 301, and on a top of the second doped region 302, where the first mask layer may include a plurality of first mask openings exposing the top of the second doped region 302; etching the second doped region 302 by using the first mask layer as a mask, to form first isolation openings in the second doped region 302; and forming the plurality of first isolation structure 304 in the first isolation openings. The plurality of first isolation structure 304 may fill up the first isolation openings.

The first mask layer may be made of a material including SiN and/or TiN. The first mask layer may be used as the mask to form the first isolation openings.

The second doped region 302 may be etched by a dry etching process, a wet etching process, or a combination thereof, using the first mask layer as the mask.

The plurality of first isolation structure 304 may be made of a material including $SiO_2$.

The third doped region 303 may be formed by a third ion implanting process, and a conductivity type of the third doping ions may be opposite to the conductivity type of the second doping ions.

In one embodiment, the conductivity type of the third doping ions may be P-type and the third doping ions may include boron ions.

Since the conductivity type of the third doping ions may be opposite to the conductivity type of the second doping ions, a PN junction may be formed between the third doped region 303 and the second doped region 302. Although the doping concentration of the second doping ions may be high, a depletion region of the PN junction formed between the third doped region 303 and the second doped region 302 may be completely depleted because the third doped region 303 may be located under the plurality of first isolation structures 304 but also between any adjacent first isolation structures 304 of the plurality of first isolation structures 304. Correspondingly, a breakdown voltage of the device may be enhanced, and the on-state resistance of the device may be reduced simultaneously since the doping concentration of the second doping ions may be high.

A drain region may be formed in the second doped region 302 and a source region may be formed in the first doped region 301 consequently. A voltage may be applied to the drain region. A size of the plurality of first isolation structures 304 along a direction from the source region to the drain region, and a number of the plurality of first isolation structures 304 along the direction from the source region to the drain region, may be configured appropriately according to a range of the voltage applied to the drain region.

In one embodiment, the voltage applied to the drain region may be about 500 V to about 700 V. The size of the plurality of first isolation structures 304 along the direction from the source region to the drain region may be about 40 μm to about 50 μm, and the number of the plurality of first isolation structures 304 along the direction from the source region to the drain region may be about 3 to about 4. The plurality of first isolation structures 304 may be used to enhance the breakdown voltage of the device.

Second isolation structures 305 may be formed in the first doped region 301 and in the second doped region 302 further.

The second isolation structures 305 may be made of a material including $SiO_2$, and may be used to electrically separate the device from surrounding devices.

As illustrated in FIG. 5, a gate structure 306 may be formed on a portion of the top of the first doped region 301, on a portion of the top of the second doped region 302, and on a portion of a top of the plurality of first isolation structures 304. Then a source region 307 may be formed in the first doped region 301 at a side of the gate structure 306, and a drain region 308 may be formed in the second doped region 302 at another side of the gate structure 306 (e.g., Step S806 in FIG. 7). A portion of the plurality of first isolation structures 304 may be located between the gate structure 306 and the drain region 308.

The gate structure 306 may include a gate dielectric layer and a gate electrode layer on the gate dielectric layer.

The gate dielectric layer may be made of a material including $SiO_2$, and the gate electrode layer may be made of a material including silicon.

The source region 307 may be doped with source ions. The source ions may have a conductivity type same as the conductivity type of the second doping ions. In one embodiment, the source ions may include N-type ions.

The drain region 308 may be doped with drain ions. The drain ions may have a conductivity type same as the conductivity type of the second doping ions. In one embodiment, the drain ions may include N-type ions.

A body region may be further formed in the first doped region at a side of the gate structure 306. The body region may be doped with body ions and the body ions may have a conductivity type same as the conductivity type of the source ions.

A voltage may be applied to the drain region. A size of the plurality of first isolation structures 304 along a direction from the source region to the drain region, and a number of the plurality of first isolation structures 304 along the direction from the source region to the drain region, may be configured appropriately according to a range of the voltage applied to the drain region, to improve the breakdown voltage and the reliability of the device.

As illustrated in FIG. 6, a dielectric layer 309 may be formed on the substra 300, on the first doped region 301, on the second doped region 302, and on sidewalls and tops of the gate structure 309. Then a portion of the dielectric layer 309 may be removed to form a plurality of interconnection openings in the dielectric layer 309. Bottoms of a first portion of the plurality of interconnection openings may expose the body region, bottoms of a second portion of the plurality of interconnection openings may expose the top of the drain region 307, and bottoms of a third portion of the plurality of interconnection openings may expose the top of the source region 308. An interconnection structure 310 may be formed in each of the plurality of interconnection openings (e.g., Step S808 in FIG. 7).

The dielectric layer 309 may be made of a material including $SiO_2$ and/or SiNO.

The dielectric layer 309 may be formed by a chemical vapor deposition process or a physical vapor deposition process.

The interconnection structures 310 may be made of a metal, and may electrically connect the body region, the source region 307, and the drain region 308, to external circuits.

The present disclosure also provides a semiconductor structure. As illustrated in FIG. 6, in one embodiment, the semiconductor structure may include: a substrate 300, a first doped region 301 in the substrate 300, a second doped region 302 in the substrate 300 and adjacent to the first doped region 301, a plurality of discrete first isolation structures 304 in the second doped region 302, a third doped region 303 under the plurality of discrete first isolation structures 304 and between adjacent first isolation structures 304 of the plurality of discrete first isolation structures 304, a gate structure 306, a source region 307 in the first doped region 301 at a side of the gate structure 306, and a drain region 308 in the second doped region 302 at another side of the gate structure 306.

The first doped region 301 may be doped with first doping ions, and the second doped region 302 may be doped with second doping ions. A conductivity type of the first doping ions may be opposite to a conductivity type of the second doping ions. The third doped region 304 may be doped with third doping ions, and a conductivity type of the third doping ions may be opposite to the conductivity type of the second doping ions. The gate structure 306 may be formed on a portion of the top of the first doped region 301, on a portion of the top of the second doped region 302, and on a portion of a top of the plurality of first isolation structures 304. A portion of the plurality of first isolation structures 304 may be located between the gate structure 306 and the drain region 308.

The plurality of first isolation structure 304 may be made of a material including $SiO_2$.

A voltage applied to the drain region may be about 500 V to about 700 V.

A size of the plurality of first isolation structures 304 along the direction from the source region to the drain region may be about 40 µm to about 50 µm, and a number of the plurality of first isolation structures 304 along the direction from the source region to the drain region may be about 3 to about 4.

A thickness of the plurality of first isolation structures 304 may be about 360 nm to about 400 nm.

The second doping ions may be used to reduce a resistance of the second doped region 302, and may have a doping concentration of about $2 \times 10^{15}$ atoms/cm$^3$ to about $3 \times 10^{15}$ atom/cm$^3$.

In the present disclosure, since the conductivity type of the third doping ions may be opposite to the conductivity type of the second doping ions, the PN junction may be formed between the third doped region and the second doped region. Although the doping concentration of the second doping ions may be high, the depletion region of the PN junction formed between the third doped region and the second doped region may be completely depleted because the third doped region may be located under the plurality of first isolation structures but also between any adjacent first isolation structures of the plurality of first isolation structures. An electric field enhancement effect may happen in the depletion region. Correspondingly, the breakdown voltage of the device may be enhanced, and the on-state resistance of the device may be low since the doping concentration of the second doping ions may be high. The breakdown voltage of the device may be improved, and the on-state resistance of the device may be reduced simultaneously.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method for a semiconductor structure, comprising:
   providing a substrate including a first doped region and a second doped region adjacent to the first doped region in the substrate, wherein the first doped region is doped with first doping ions and the second doped region is doped with second doping ions having a conductivity type opposite to a conductivity type of the first doping ions;
   forming a plurality of first isolation structures in the second doped region, wherein the plurality of first isolation structures are discrete from each other;
   forming a third doped region in the second doped region between each two adjacent first isolation structures of the plurality of first isolation structures and under the plurality of first isolation structures, each two adjacent first isolation structures of the plurality of first isolation structures being isolated from each other by the third doped region, wherein the third doped region is doped with third doping ions and the third doping ions have a conductivity type opposite to the conductivity type of the second doping ions;
   forming a gate structure on a portion of a surface of the first doped region, on a portion of a surface of the second doped region, and on a portion of surfaces of the plurality of first isolation structures;
   forming a source region in the first doped region at a side of the gate structure; and
   forming a drain region in the second doped region at another side of the gate structure, wherein a portion of the plurality of first isolation structures is located between the gate structure and the drain region.

2. The fabrication method according to claim 1, wherein forming the plurality of first isolation structures includes:
   forming a first mask layer on the substrate, on the first doped region, and on the second doped region, wherein the first mask layer includes a plurality of first mask openings exposing the second doped region;
   etching the second doped region by using the first mask layer as a mask, to form first isolation openings; and
   forming the plurality of first isolation structures in the first isolation openings, wherein each of the plurality of first isolation structures fills up a corresponding first isolation opening.

3. The fabrication method according to claim 1, wherein:
   the plurality of first isolation structures is made of a material including SiO2, SiNOx, or a combination thereof.

4. The fabrication method according to claim 1, wherein:
   a voltage applied on the drain region is about 500 V to about 700 V.

5. The fabrication method according to claim 4, wherein along a direction from the source region to the drain region:
   a sum of a size of each of the plurality of first isolation structures is about 40 µm to about 50 µm; and
   a number of the plurality of first isolation structures is about 3 to about 4.

6. The fabrication method according to claim 1, wherein:
   a thickness of the plurality of first isolation structures is about 360 nm to about 400 nm.

7. The fabrication method according to claim 1, wherein:
   a concentration of the second doping ions is about $2 \times 10^{15}$ atoms/cm$^3$ to about $3 \times 10^{15}$ atoms/cm$^3$.

8. A semiconductor structure, comprising:
   a substrate;
   a first doped region and a second doped region adjacent to the first doped region in the substrate, wherein the first doped region is doped with first doping ions and the second doped region is doped with second doping ions having a conductivity type opposite to a conductivity type of the first doping ions;
   a plurality of first isolation structures in the second doped region, wherein the plurality of first isolation structures are discrete from each other;
   a third doped region in the second doped region between each two adjacent first isolation structures of the plurality of first isolation structures and under the plurality of first isolation structures, each two adjacent first isolation structures of the plurality of first isolation structures being isolated from each other by the third doped region, wherein the third doped region is doped with third doping ions and the third doping ions have a conductivity type opposite to the conductivity type of the second doping ions;
   a gate structure on a portion of a surface of the first doped region, on a portion of a surface of the second doped region, and on a portion of surfaces of the plurality of first isolation structures;
   a source region in the first doped region at a side of the gate structure; and
   a drain region in the second doped region at another side of the gate structure, wherein a portion of the plurality of first isolation structures is located between the gate structure and the drain region.

9. The semiconductor structure according to claim 8, wherein:
   the plurality of first isolation structures is made of a material including $SiO_2$, $SiNO_x$, or a combination thereof.

10. The semiconductor structure according to claim 8, wherein a voltage applied on the drain region is about 500 V to about 700 V.

11. The semiconductor structure according to claim 8, wherein along a direction from the source region to the drain region:
   a sum of a size of each of the plurality of first isolation structures is about 40 μm to about 50 μm; and
   a number of the plurality of first isolation structures is about 3 to about 4.

12. The semiconductor structure according to claim 8, wherein a thickness of the plurality of first isolation structures is about 360 nm to about 400 nm.

13. The semiconductor structure according to claim 8, wherein:
   a concentration of the second doping ions is about $2 \times 10^{15}$ atoms/cm$^3$ to about $3 \times 10^{15}$ atoms/cm$^3$.

14. The semiconductor structure according to claim 8, wherein:
   at least two of the plurality of first isolation structures are located between the gate structure and the drain region and have no contact with the gate structure.

* * * * *